US007352608B2

United States Patent
Mohanty et al.

(10) Patent No.: US 7,352,608 B2
(45) Date of Patent: Apr. 1, 2008

(54) CONTROLLABLE NANOMECHANICAL MEMORY ELEMENT

(75) Inventors: Pritiraj Mohanty, Boston, MA (US); Robert L. Badzey, Brookline, MA (US); Alexei Gaidarzhy, Allston, MA (US); Guiti Zolfagharkhani, Allston, MA (US)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 11/597,150

(22) PCT Filed: May 24, 2005

(86) PCT No.: PCT/US2005/018490

§ 371 (c)(1), (2), (4) Date: Nov. 21, 2006

(87) PCT Pub. No.: WO2006/076037

PCT Pub. Date: Jul. 20, 2006

(65) Prior Publication Data

US 2007/0274123 A1    Nov. 29, 2007

Related U.S. Application Data

(60) Provisional application No. 60/573,957, filed on May 24, 2004.

(51) Int. Cl.
*G11C 13/00* (2006.01)
(52) U.S. Cl. ...................... 365/151; 365/129; 977/932; 977/943
(58) Field of Classification Search ................. 365/151
See application file for complete search history.

(56) References Cited

U.S. PATENT DOCUMENTS

| | | | |
|---|---|---|---|
| 4,979,149 A | 12/1990 | Popovic et al. | |
| 5,774,414 A | 6/1998 | Melzner et al. | |
| 6,054,745 A | 4/2000 | Nakos et al. | |
| 6,495,905 B2 | 12/2002 | Frazier et al. | |
| 6,548,841 B2 * | 4/2003 | Frazier et al. | 257/254 |
| 6,574,130 B2 * | 6/2003 | Segal et al. | 365/129 |
| 6,781,166 B2 * | 8/2004 | Lieber et al. | 257/211 |
| 6,803,840 B2 * | 10/2004 | Hunt et al. | 333/186 |
| 6,982,616 B2 * | 1/2006 | Nakanishi et al. | 335/78 |
| 6,982,903 B2 * | 1/2006 | Berlin et al. | 365/163 |
| 6,990,009 B2 * | 1/2006 | Bertin et al. | 365/15 |
| 7,061,791 B2 * | 6/2006 | Bocian et al. | 365/151 |

* cited by examiner

*Primary Examiner*—Son L. Mai
(74) *Attorney, Agent, or Firm*—Wolf, Greenfield & Sacks, P.C.

(57) ABSTRACT

A memory device includes a mechanical element that exhibits distinct bistable states under amplitude modulation. The states are dynamically bistable or multi-stable with the application of a drive signal of a given frequency. The natural resonance of the element in conjunction with a hysteretic effect produces distinct states over a specific frequency range. Devices with multiple elements that respond to different frequency ranges provided on a common contact are formed with improved density. The devices may be excited and read with magnetomotive, capacitive, piezoelectric and/or optical methods. The devices may be planar oriented or out of plane oriented to permit three dimensional memory structures. DC biases may be used to shift frequency responses to permit an alternate method for differentiating states of the element.

24 Claims, 16 Drawing Sheets

CONTROLLABLE NANOMECHANICAL MEMORY ELEMENT

CROSS REFERENCE TO RELATED APPLICATIONS

This application claims the priority of U.S. Provisional Application No. 60/573,957 filed on May 24, 2004 entitled, CONTROLLABLE NANO MECHANICAL MEMORY ELEMENT, the whole of which is hereby incorporated by reference herein.

STATEMENT REGARDING FEDERALLY SPONSORED RESEARCH OR DEVELOPMENT

This invention was made with Government Support under Contract No. ECS-0404206 awarded by the National Science Foundation. The Government has certain rights in the invention.

BACKGROUND OF THE INVENTION

1. Field of the Invention

The present invention relates generally to nanomechanical memory devices, and relates more particularly to a nanomechanical device that exhibits discrete states under specific stimuli.

2. Description of Related Art

For many years, semiconducting devices have been used to fabricate memory arrays or storage units. The fabrication of such devices on a micrometer scale has provided a number of attractive advantages in reducing the size and power of large scale integrated circuits. Indeed, with each new semiconducting device generation, smaller, reduced power and typically faster devices are produced.

However, such advances will not go on indefinitely. The National Technology Roadmap for Semiconductors postulates that due to physical and economic reasons, the current scaling advances will continue only until the year 2010 or so. Transistor elements used in processors face serious obstacles, including excess heating, power requirements, and tunneling effects.

Memory can be broken up into two general groups: volatile and non-volatile. Volatile memory does not retain state information once power to the memory element is turned off. However, volatile memory has several advantages and is typically used for fast access or swapping of information between the processing and storage elements. Non-volatile memory, on the other hand, retains state information until it is changed, and is typically used for longer term storage.

Volatile memory is often provided as DRAM (Dynamic Random Access Memory) chips on computer motherboards for fast access. Non-volatile memory is often seen in the form of flash memory and hard drives, each of which may be slower than DRAM, but provide more robust long term storage. Flash memory is similar in structure to RAM and is typically composed of electro-capacitive elements. Hard drives are often formed with paramagnetic islands used to store information.

Regardless of the form a memory cell takes, present realizations of computer memory face two serious challenges involving scaling and fragility. As electronic memory elements are made smaller, significant challenges arise with respect to processing individual components. With regard to magnetic memory elements, packing density is limited by the superparamagnetic limit. The superparamagnetic limit is the point at which individual memory elements or bits begin to interact with each other and lose independence with respect to individual state information.

The issue of fragility refers to the susceptibility of electro-capacitive memory and processor elements to electromagnetic radiation and particle discharges. Magnetic elements also can be altered in the presence of large magnetic fields. In addition, magnetic hard drives involve platters and read/write heads which are susceptible to impact shock.

One type of memory element that addresses the issues of scaling and fragility is a micromechanical memory element. Micromechanical memory elements have greater packing density, or a smaller size, while decreasing fragility of the device. Micromechanical memory elements are known and have been profiled in numerous other documents, notably U.S. Pat. No. 4,979,149 (Popovic et al.) and U.S. Pat. No. 5,774,414 (Melzner et al.), and references therein. However, these types of memory elements with critical dimensions in the micron range have not been able to achieve either the packing densities or read/write speeds that would make them competitive with conventional electro-capacitive or magnetic devices in present commercial settings.

One advantageous feature of a memory element, mechanical or otherwise, is the existence of multi-state stability in the device. Typical devices exhibit bistability, where the device is in one state to define a "1" and another state to define a "0". The two states may then be used to perform binary computation in a computing engine. A critical function of these devices is the ability to read or change the state of the device. In the case of electro-capacitive elements, such as the conventional RAM and ROM memories, reading and writing states involves the addition or subtraction of electronic charge. In mechanical elements, state reading and writing is typically resolved through the manipulation of the element into two distinct positional states. Micromechanical elements have been fabricated with enough intrinsic compressive stress to place them into a condition of bistability manifested by a convex or concave buckling effect. This is a static bistable condition and cannot be easily changed once the device is fabricated.

The read/write procedure for the bistable mechanical memory elements described above is straightforward and intuitive, perhaps because of the mechanical features of the element. In the case of mechanical elements that have critical dimensions in the sub-micron range, however, positionally distinct states are a non-optimal solution. The reduced usefulness of positionally distinct states for elements having sub-micron dimensions detracts from the ability of the elements to achieve competitive read/write speeds and packing densities. In contrast, nanomechanical elements are small enough to achieve competitive packing densities, and their small size leads to an intrinsically high natural frequency of motion, allowing for very fast read/write times. See, e.g., U.S. Pat. Nos. 6,495,905, 6,574,130, 6,781,166 and 6,548,841.

Nanomechanical elements tend to possess features that preclude easy monitoring of their positional states. Their surface-to-volume ratio is higher than that of micron-size or millimeter-size devices of the same geometry, which leads to a greater sensitivity to both friction and sticking effects. This greater sensitivity prevents physical manipulation of such nanomechanical devices, as such forces are often strong enough to cause failure or destruction during manipulation. Additionally, due to their intrinsically high stiffness, nanomechanical elements often possess very small amplitudes of motion, even when subjected to very large forces. Stiffness typically scales inversely with system size and therefore proportionally to the natural frequency of the device. For example, a device with a natural frequency in the GHz range can often possess such high stiffness that it exhibits an amplitude of motion that may only be in the range of picometers (pm or $10^{-12}$ m).

The desired specifications for speed and size of nanomechanical elements compete with measurement of the positional state of the element. It is thus desirable to operate nanomechanical memory elements in a manner that is fundamentally different from micromechanical elements.

It would be desirable to obtain a nanomechanical device without positional or static bistability. It would further be desirable to obtain a nanomechanical memory device that is not fabricated with the addition of compressive forces to form an intrinsically bistable device.

BRIEF SUMMARY OF THE INVENTION

In accordance with the present invention, there is provided a bistable nanomechanical device that exhibits a dynamic bistability. Dynamic bistable states are achieved in the mechanical device based on vibrational amplitude, rather than physical position or orientation. Driving forces sufficient to force an intrinsic linear device into a non-linear and bistable modes are applied to the device. The resulting dynamic bistable states each possess a distinctive signature through the formation of a hysteresis loop in the frequency response of the device near the natural resonance frequency. The hysteresis exhibited by the device permits the device to exhibit two different states, represented by a high amplitude and a low amplitude in a given range of frequencies.

In accordance with an aspect of the present invention, the nanomechanical memory elements may be stimulated according to various techniques. One such technique is magnetomotive stimulation, which relies on large magnetic fields. Other techniques include capacitive, piezoelectric and optical. According to an advantage of the present invention, the nanomechanical device is excited with a modulated AC signal, and resulting motion is detected through changes in voltage. According to another advantage of the present invention, the nanomechanical device is excited with a modulated AC signal, and the resulting motion is detected by measuring interference patterns generated with a laser directed at the nanomechanical device. According to another advantage of the present invention, the nanomechanical device is fabricated from a piezoelectric material and subjected to piezoelectric excitation. The resultant motion is detected by measuring strain-induced voltages between a top and bottom of the nanomechanical element.

According to another aspect of the present invention, the nanomechanical device may be fabricated in accordance with a number of techniques including semiconductor fabrication techniques. The materials used to fabricate the nanomechanical include but are not limited to silicon on insulator (SOI) materials, silicon nitride (SiN), silicon carbide (SiC), gallium arsenide (GaAs), gallium nitride (GaN), quartz and diamond. In addition, the nanomechanical device structures may be composed of pure metals, bimetallic strips or other heterogeneous material compositions including semiconductor-metal compositions, multiple semiconductor material compositions, and so forth.

In accordance with another feature of the present invention, the nanomechanical device can be composed of materials that permit the formation of the device with a built in compressive strain. According to this feature of the present invention, the devices are inherently non-linear, and may be driven by very small AC forces or signals, significantly reducing device power.

In accordance with another aspect of the present invention, the nanomechanical devices can be made to be multistable elements where the device possesses more than two distinct states. The introduction of non-linearity into the nanomechanical device permits the creation of multiple distinct amplitude states in a single nanomechanical element.

According to another aspect of the present invention, several nanomechanical elements, each having different structural characteristics can be provided on a single contact to permit multiple resonance frequencies for an element, addressable through a single contact. The multiple element configuration with a single contact reduces practical element size and/or increases memory element density.

According to another aspect of the present invention, the nanomechanical element exhibits a hysteretic frequency response, so that the element has a first maximum amplitude with increasing scanning frequency and second maximum amplitude with decreasing scanning frequency. The increasing and decreasing frequency scans define a region of frequencies in which the nanomechanical element is bistable. Excitation at a single frequency within the hysteretic region permits the device to assume one of two distinct amplitude states.

In accordance with another aspect of the present invention, a radio frequency (RF) lock-in is used to monitor a voltage signal derived from the nanomechanical element to determine the amplitude state of the device. A modulation signal is provided with an RF source to institute a read/write function in the nanomechanical element.

According to another aspect of the present invention capacitive coupling is provided with the nanomechanical element to implement a read/write operation. According to a feature of the present invention, an RF drive is provided to one capacitive coupling and an RF detect operation is obtained at another capacitive coupling, so that manipulation of the nanomechanical element may be performed and a state of the nanomechanical element may be detected.

According to another aspect of the present invention, an array of capacitively coupled nanomechanical elements is provided through conventional semiconductor fabrication techniques. Each element in the array is addressed through capacitive coupling with modulated RF inputs and an RF lock-in output or reading device.

According to another aspect of the present invention, a piezoelectric driven nanomechanical element is provided having contacts for read/write operations. A voltage difference applied between different electrodes induces a mechanical strain in the device, resulting in a voltage signal that may be read through separate voltage sensitive contacts. The voltage difference may be applied as an AC or RF signal, with a modulation that selects the read/write operation.

According to another embodiment of the present invention, dynamic states for the nanomechanical element are derived as torsional, shear or longitudinal states. In addition, or alternatively, the element may have different geometries including paddle shapes, diaphragms, vertical rods, beams, cantilevers, or combinations of these geometries.

According to another embodiment of the present invention, a DC bias is applied to the nanomechanical element of the present invention to induce a frequency shift in the response of the element. Distinct states are represented by distinct frequency responses based on the application of a given DC bias. Any number of DC biases may be applied to the element to produce a like number of distinct frequency based states. The amount and range of DC biases can be varied to specify given tolerances for discriminating states based on frequency response.

BRIEF DESCRIPTION OF THE DRAWINGS

The invention will be more fully understood by reference to the following description of the invention in conjunction with the drawings, in which.

DETAILED DESCRIPTION OF THE PREFERRED EMBODIMENTS

Figure 1A:
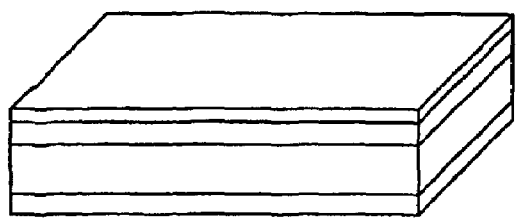
FIGS. 1(a)-1(f) are perspective views of stages of fabrication for a nanomechanical doubly clamped suspended beam memory device.
Figure 1D:
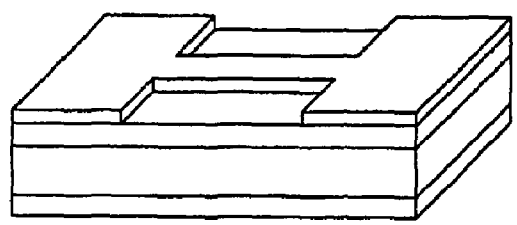
Figure 1B:
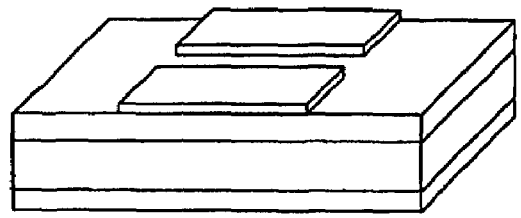
Figure 1E:
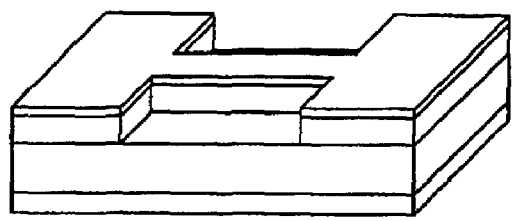
Figure 1C:
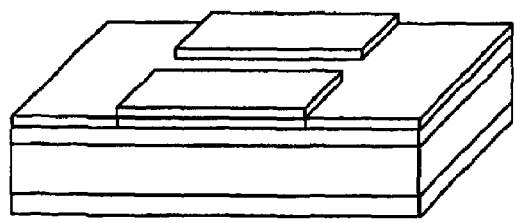
Figure 1F:
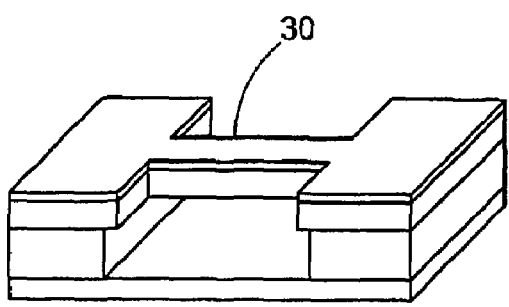
Figure 2:
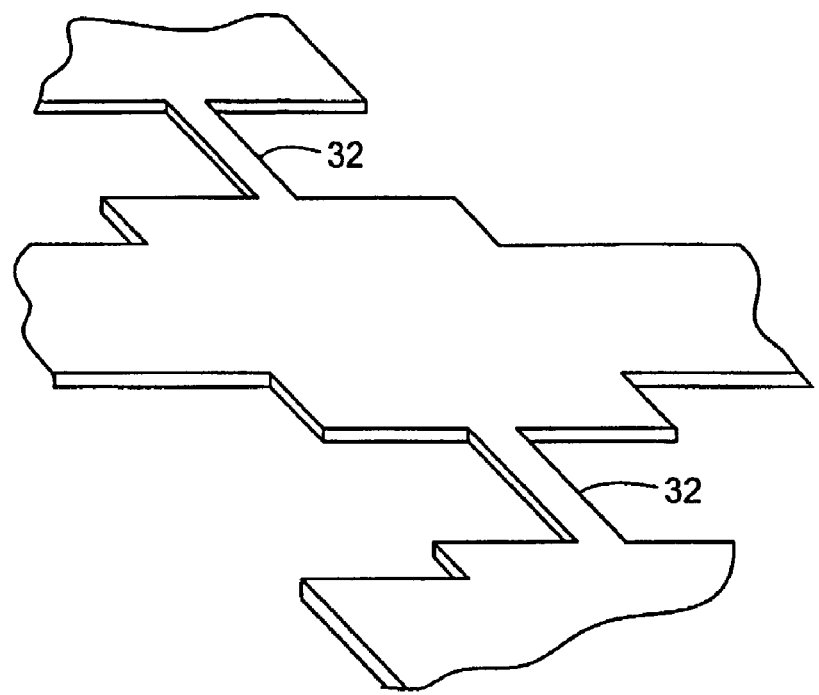
FIG. 2 is a perspective view of several individually addressed beam structures.

Referring now to FIGS. 1(a)-1(f), a sequence of fabrication steps for a doubly clamped suspended beam 30 are illustrated. The device is produced with conventional semiconductor fabrication methods beginning with a multilayer structure in FIG. 1(a). The beam pattern is created with lithography techniques in FIG. 1(b), and metalized in FIG. 1(c). FIG. 1(d) illustrates the masking and removal of excess metal and patterning material. FIGS. 1(e) and 1(f) show the removal of material to free beam 30 through anisotropic reactive ion etching (RIE) and isotropic RIE, respectively. Alternatively, it is possible to use a wet etch method for both anisotropic and isotropic etching steps, or any combination of wet etch and RIE. FIG. 2 illustrates a pair of doubly clamped beams 32 that may be formed according to the process illustrated in FIGS. 1(a)-1(f). The two identical individually addressed doubly clamped beams 32 are approximately 8 μm long×300 nm wide×200 nm thick in this exemplary embodiment.

A bistable nanomechanical device formed according to the above-described process can exhibit a dynamic bistability. That is, rather than providing two states based on simple physical position or orientation, beams 32 exhibit dynamic bistability to provide two states based on vibrational amplitude. The two distinct states are obtained through the application of driving forces sufficient to put doubly clamped beam 32 into a nonlinear state. Beam 32 may be provided as an intrinsically linear device that is converted to exhibit nonlinear characteristics and bistability through the application of appropriate driving forces.

Figure 9:
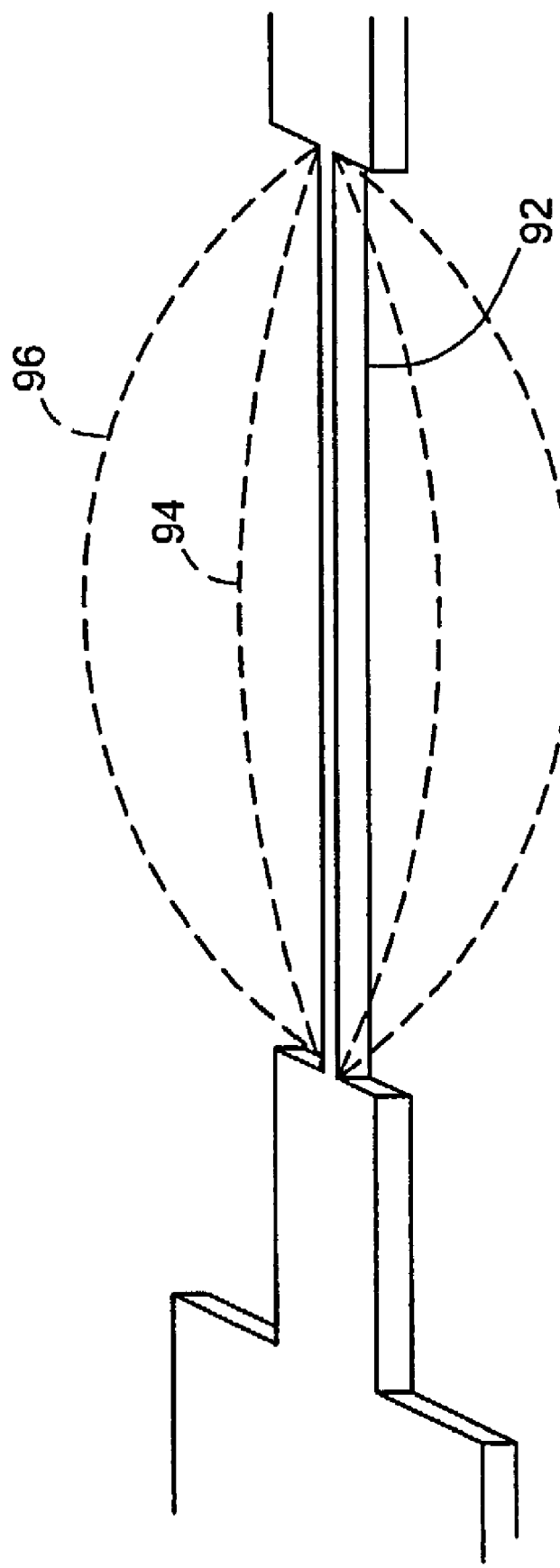
FIG. 9 is a perspective view of a doubly clamped beam with an exaggerated illustration of different amplitude states.

Referring for a moment to FIG. 9, a beam 92 is illustrated with exaggerated oscillation amplitude envelopes 94 and 96, for small and large amplitudes, respectively. When beam 92 is excited with a driving oscillation, the nonlinear characteristics of beam 92 produce two distinct amplitude modes, as illustrated by envelopes 94 and 96. The amplitude of oscillation attained by beam 92 depends upon the frequency at which it is driven. Accordingly, beam 92 can achieve two separate, stable states without resorting to mechanically static or position oriented bistability resulting from compressive forces.

Figure 3:
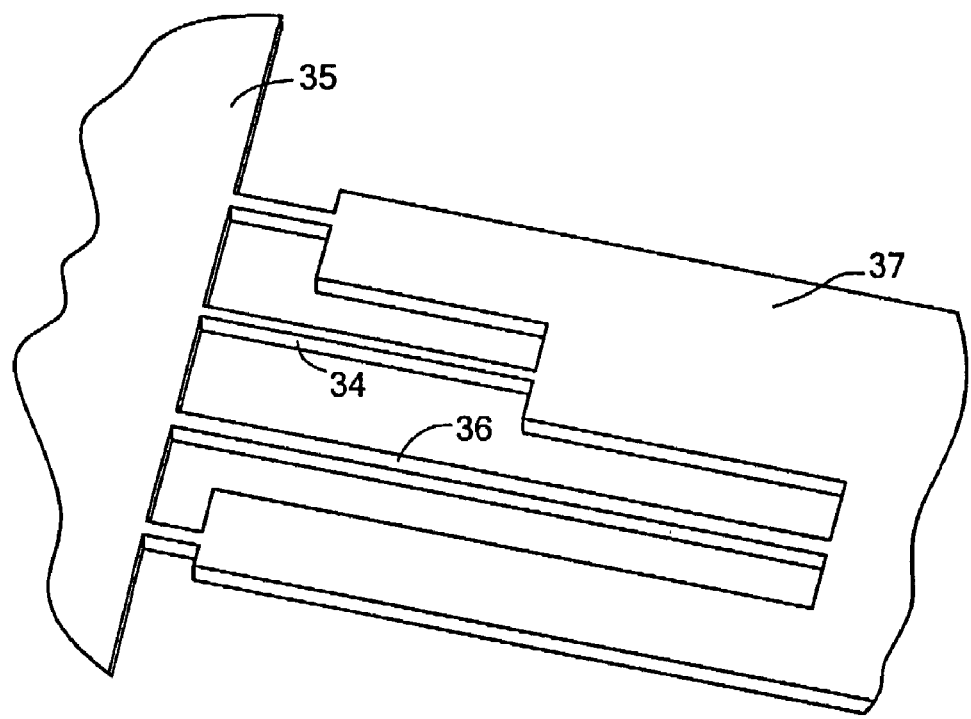
FIG. 3 is a perspective view of an array of differently sized doubly clamped beams that are individually addressable through a single contact.

Beams with different dimensions have different resonance frequencies, leading to different specific activation frequencies for each beam. Referring to FIG. 3, a number of differently dimensioned beams 34, 36 are illustrated, each of which has unique resonance frequencies. Beams 34, 36 are clamped at either end by the same contacts 35, 37, so that each can be addressed using a single contact. A frequency signal for generating a desired response from beam 34 can coexist with a frequency signal targeting beam 36 on the same contact. Additionally, all four (or more) beams can be addressed singly or together to create a single element with multiple states. That is, a particular combination of "1" and "0" states among all four bridges can define a single "superstate" which is unique and used as the basis for information storage. A single contact with a series of frequency-dependent read/write signals is used to place the array into a particular combination or to read a given combination.

Accordingly, the present invention permits memory structures with a dense packing and high functionality useful in providing arrays of memory elements.

Figure 4:
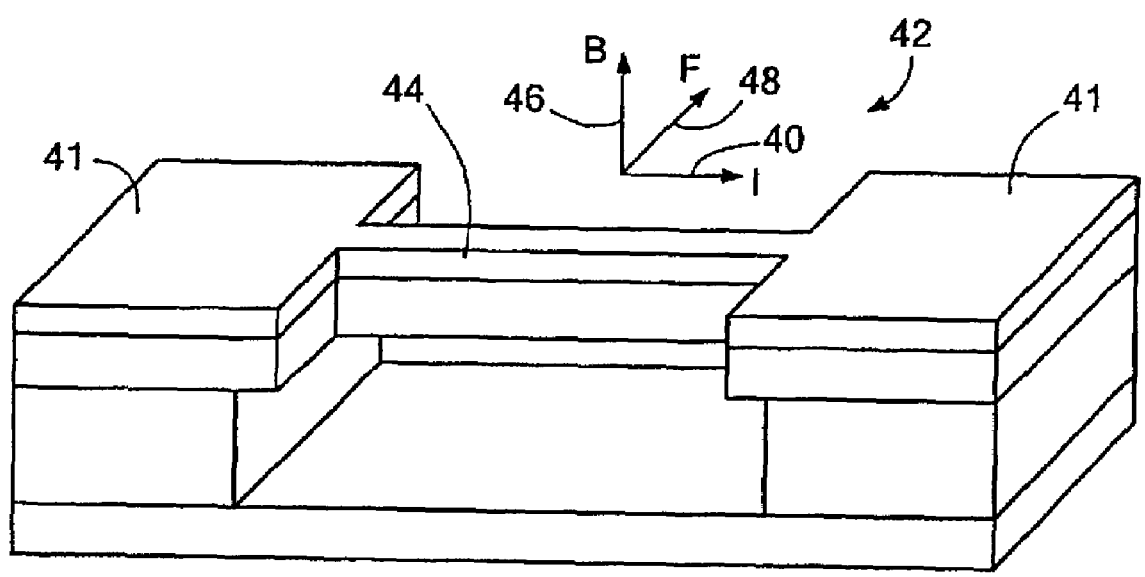
FIG. 4 is an illustration of a doubly clamped beam for explaining magnetomotive excitation/detection in the read/write operation.
Figure 5:
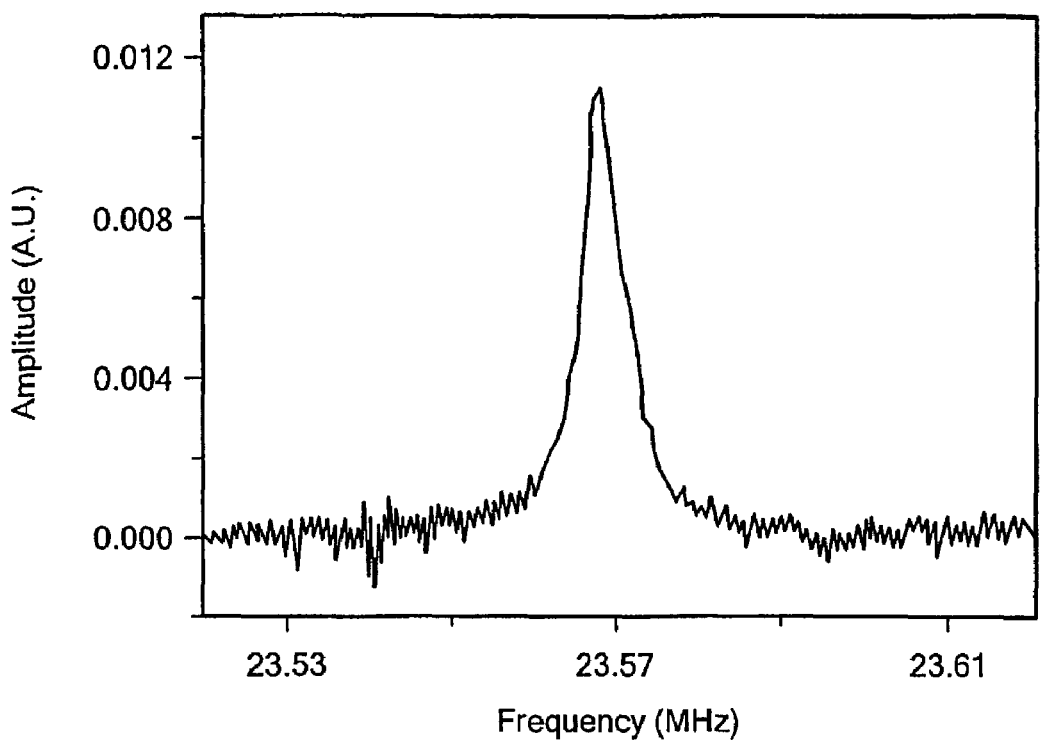
FIG. 5 is a graph illustrating a linear excitation response of a doubly clamped bridge structure.

Nanomechanical devices, such as a doubly clamped beam 42 illustrated in FIG. 4, are excited according to an exemplary embodiment with a magnetomotive technique. When an AC current 40 is driven through an electrode 44 atop doubly-clamped beam 42 in the presence of a perpendicular magnetic field 46, a resultant Lorentz force 48 causes beam 42 to move in a direction perpendicular to both current 40 and field 46. As beam 42 oscillates, it sweeps through a given area of magnetic flux, which generates an EMF (electromotive force) proportional to the velocity of motion through field 46. This EMF produces a voltage on contact pads 41 securing beam 42. With harmonic motion, this velocity is proportional to the displacement amplitude of beam 42. Sweeping through frequencies for AC current 40 yields the distinct Lorentzian peak of a damped, driven harmonic oscillator, illustrated in FIG. 5. The center of the peak in FIG. 5 is the resonance frequency of the bridge. The full width at half maximum (FWHM) of the peak determines the quality factor, or Q of the device.

Figure 6:
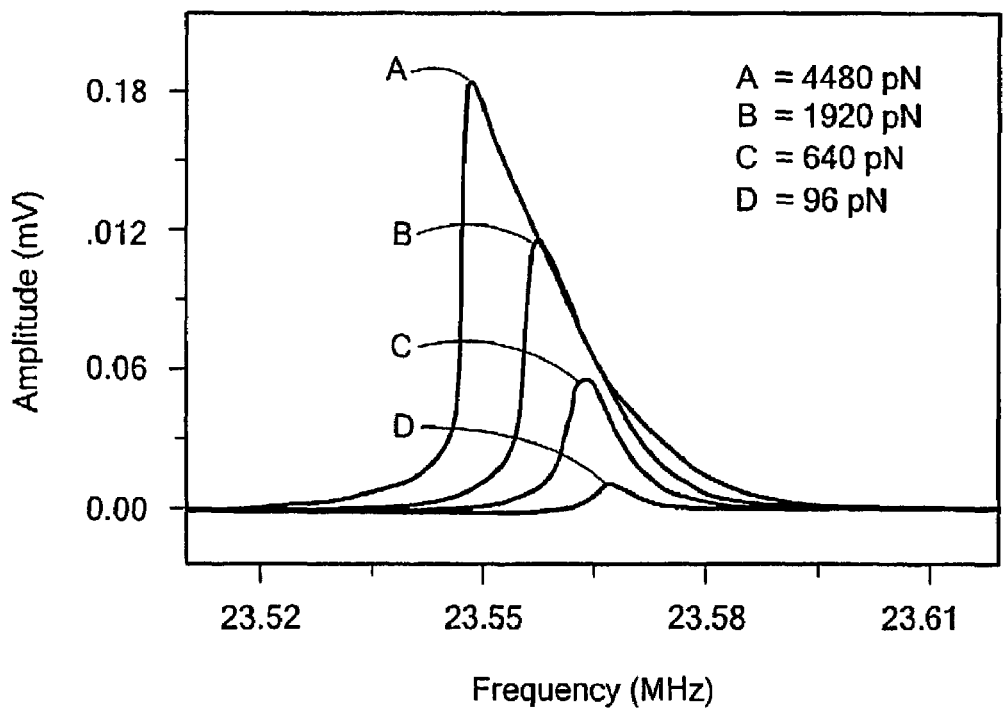
FIG. 6 is a graph illustrating a series of frequency responses resulting from different drive amplitudes applied to the nanomechanical element of the present invention.

When the driving force provided by AC current 40 is sufficiently strong, the response of beam 42 deviates from the traditional linear Lorentzian response illustrated in FIG. 5 and instead assumes the distinctive shape of a nonlinear oscillator. FIG. 6 illustrates several nonlinear responses that become less linear with increased amplitude. The nonlinear response is also characterized by a hysteresis loop observed by sweeping forward and backwards through the frequencies around the resonance frequency.

Figure 8:
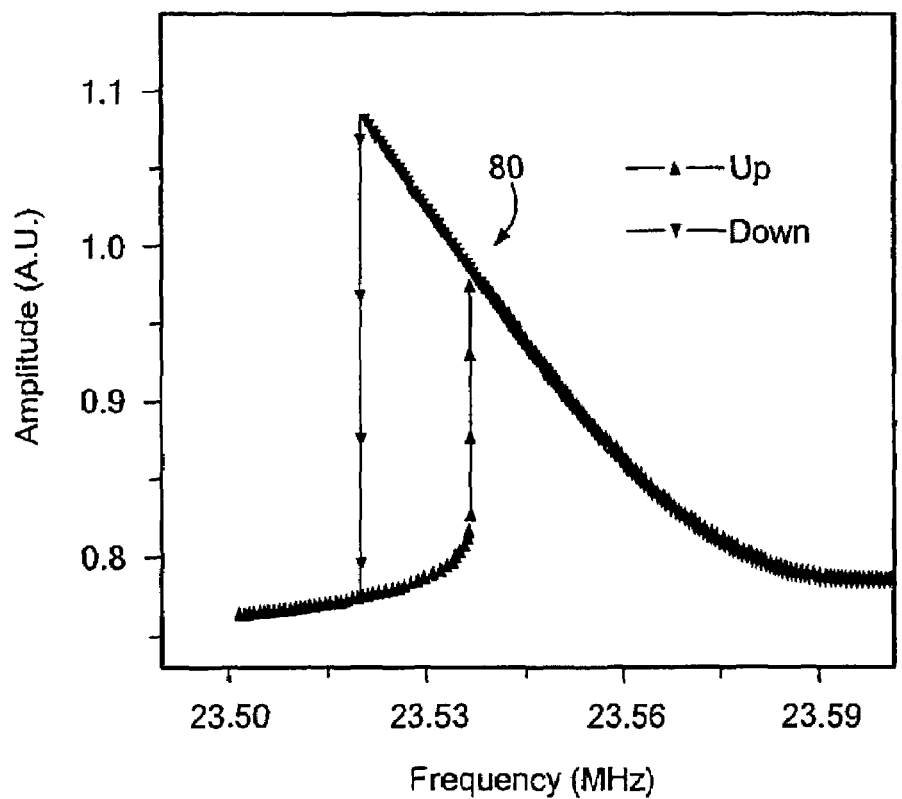
FIG. 8 is a graph illustrating a hysteretic frequency response of a bistable non-linear oscillator realized in accordance with the present invention.

Referring for a moment to FIG. 8, a hysteretic frequency response for beam 42 driven by a sufficiently strong AC current 40 to produce nonlinear behavior is illustrated. Within a range of frequencies defined by the boundaries of a hysteretic region 80, oscillating beam 42 can occupy one of two dynamic bistable states distinguished by their respective velocities or amplitudes. By driving beam 42 at a single frequency within hysteresis region 80, beam 42 can be manipulated into two bistable states through the addition of a modulation signal.

Figure 10:
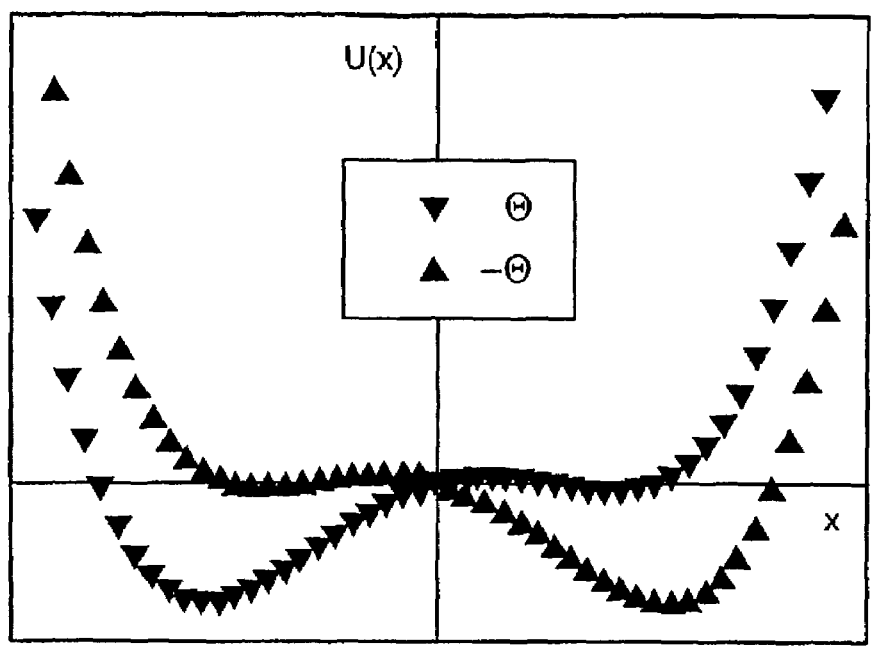
FIG. 10 is a graph illustrating beam potential relating to restoring force in the presence of a modulation signal.

FIG. 10 depicts a change that occurs to the double-well beam potential with the addition of a modulation signal. The potential is biased in one direction or another by the modulation, forcing the beam into one or the other state. In this way it is possible to control the state of the device through application of a modulation.

Figure 7:
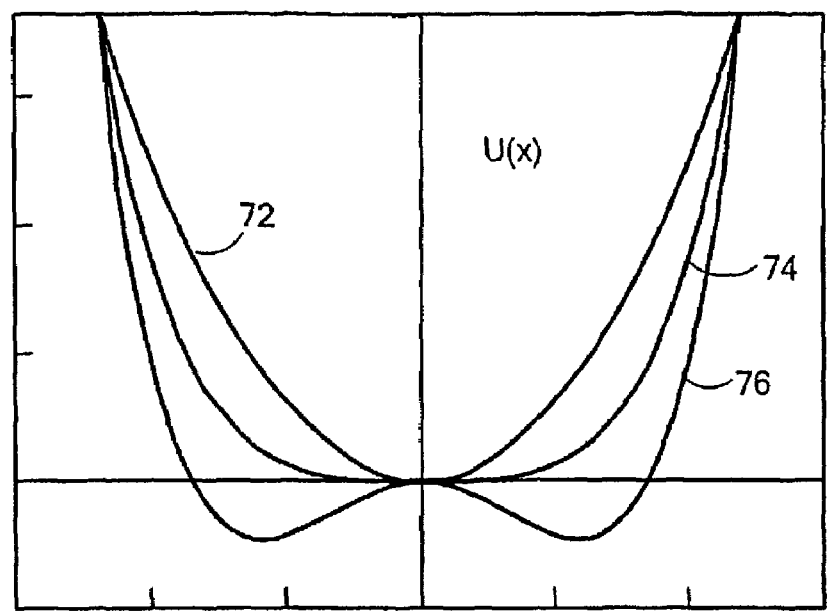
FIG. 7 is a graph illustrating a beam potential related to restoring force as a result of different drive amplitudes applied to the nanomechanical element.

As beam 42 is driven beyond a linear region, the potential describing the restoring force of the oscillator also changes. With drive amplitudes that produce a linear response, the beam potential is the classic quadratic shape of a linear harmonic oscillator. This shape is illustrated as plot 72 in the graph of FIG. 7. As drive amplitude increases, the shape of the beam potential evolves into a quartic shape, illustrated in plot 74. Further amplitude increases produce a double-well shape, illustrated in plot 76. Plot 76 indicates operation of the beam as a nonlinear resonator.

Figure 11:
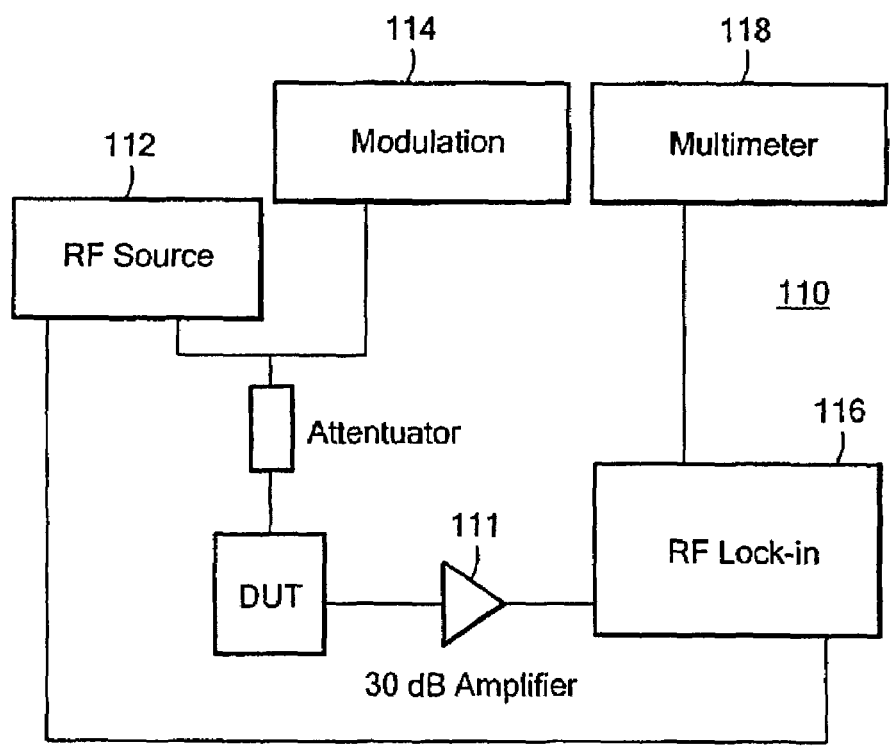
FIG. 11 is a schematic block diagram of a read/write arrangement for a nanomechanical element in accordance with an embodiment of the present invention.

Referring for a moment to FIG. 11, a schematic diagram 110 of a circuit used to magneto-motively excite a single doubly-clamped bridge structure into nonlinear response and institute a read/write sequence through the addition of a modulation signal is illustrated. An RF source 112 provides an AC signal for exciting the bridge structure, with modulation provided from modulator 114. An RF lock-in 116 serves to monitor a voltage signal from the element as passed through an amplifier 111. A multimeter 118 measures the voltage signal to determine the occupied amplitude state of the element.

Figure 12:
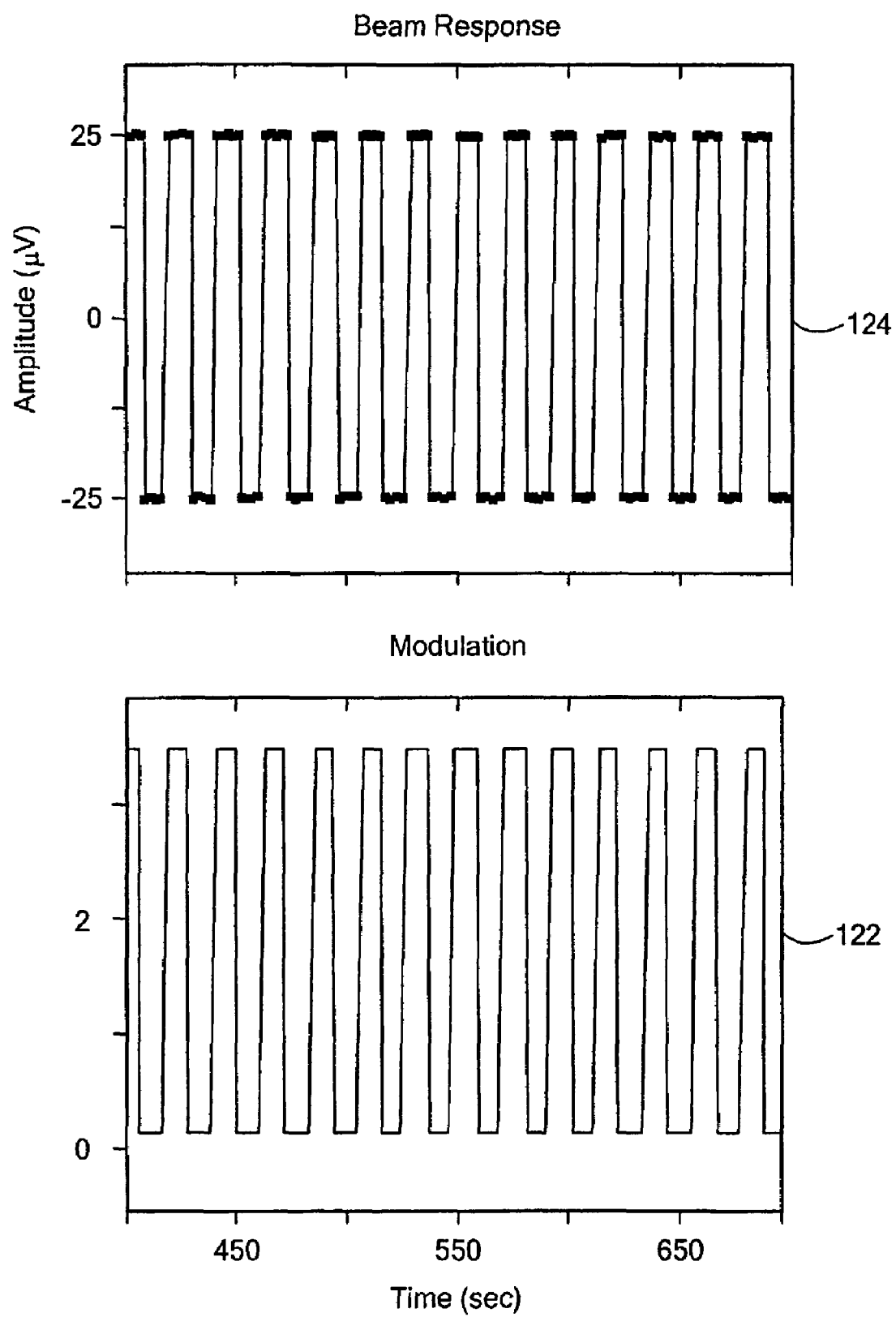
FIG. 12 is a pair of graphs of illustrating signal modulation applied to a nanomechanical element according to the present invention and a corresponding beam response.

Referring momentarily to FIG. 12, a typical read/write sequence for a single nanomechanical memory element is shown. The modulation signal in graph 122 is a square wave, and the response of the element in graph 124 is the voltage reading from the RF lock-in described in FIG. 11. The voltage difference between the two amplitude states is approximately 2 μV, after factoring out amplification, in this exemplary embodiment.

Figure 13:
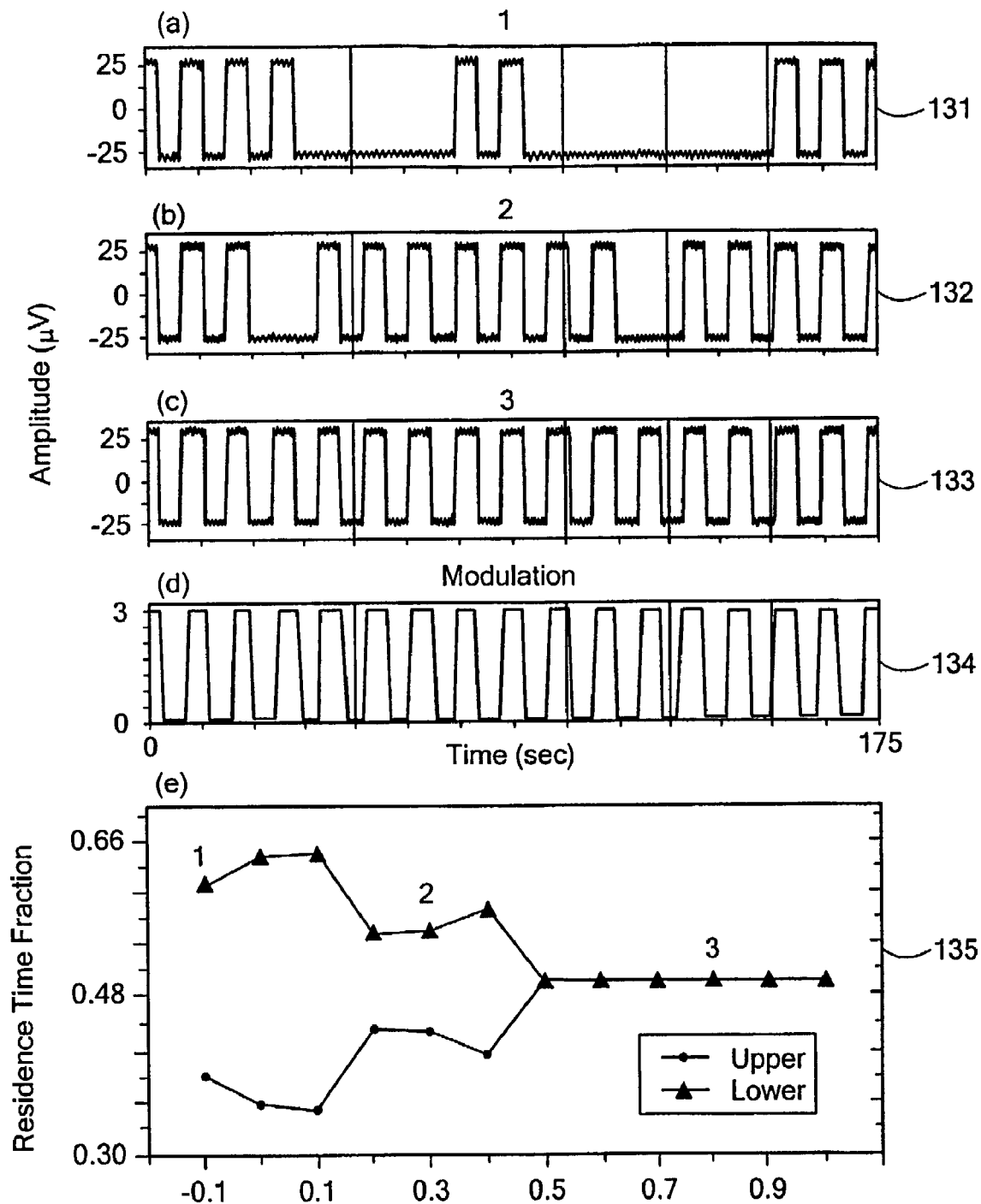
FIG. 13 is a set of graphs illustrating beam response as a result in variations in modulation amplitude.

Referring to FIG. 13, a series of graphs 131-134 illustrate progressive increases in modulation amplitude. At small modulation amplitudes, the beam experiences a loss in fidelity, which reflects the presence of a threshold amplitude appropriate for reproducible and controllable switching.

Figure 14:
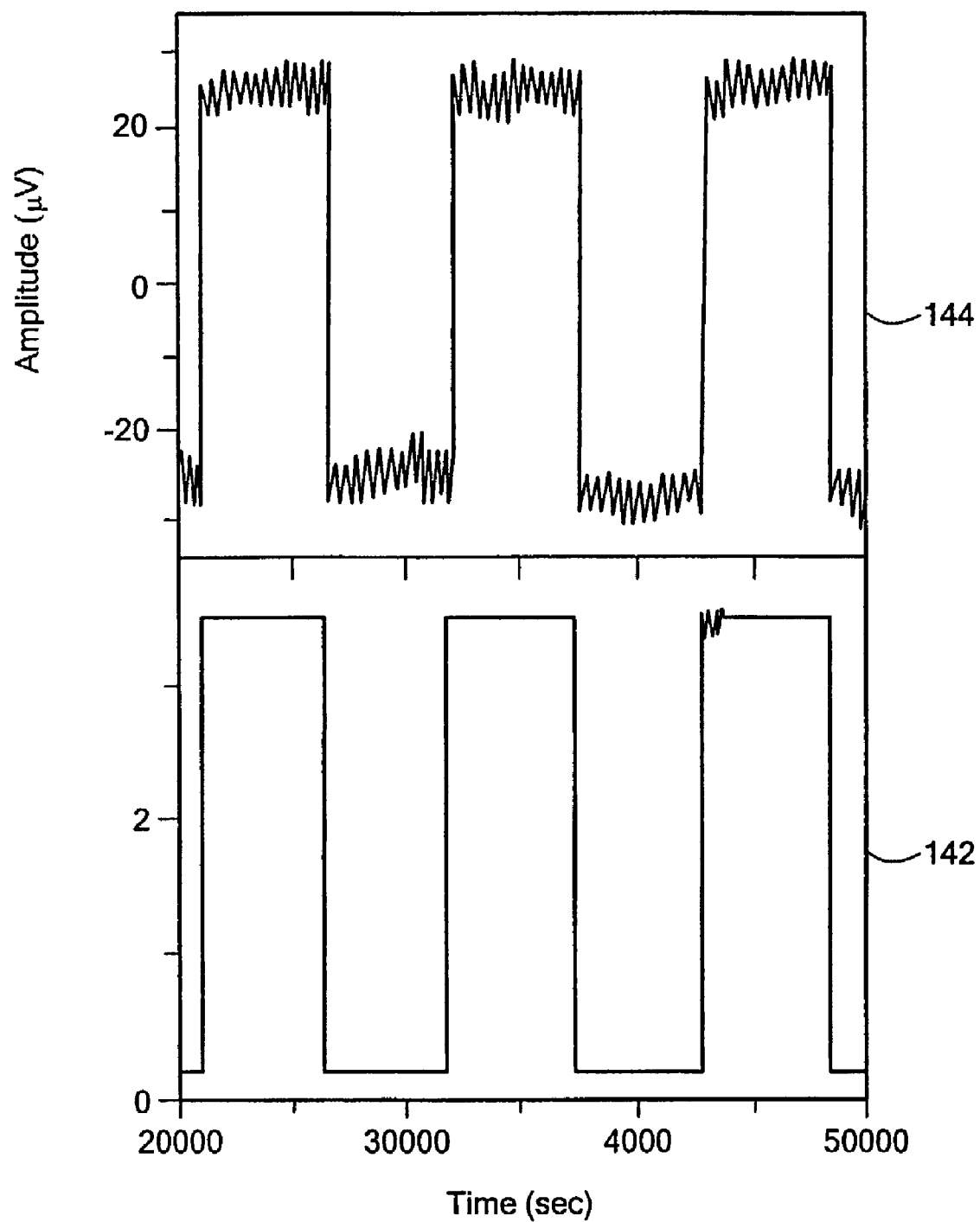
FIG. 14 is a pair of graphs illustrating beam response resulting from a modulation signal applied over relatively long periods of time.

Referring to FIG. 14, stability of the device over relatively long periods is illustrated in graphs 142, 144. In this exemplary embodiment, the modulation and RF driving signals are of sufficient amplitude to avoid the need to refresh the memory element. As illustrated in graphs 142, 144, the memory elements are stable throughout time intervals on the order of hundreds of seconds. Accordingly, the memory elements of the present invention are comparable to SRAM, which need not be refreshed, as opposed to DRAM, which is refreshed constantly.

Due to the intrinsic dependence of the frequency of an individual element on its dimensions, the mechanical elements operated in accordance with the present invention possess the distinct advantage that a reduction in size naturally leads to an increase in the speed of the device. That is, higher packing densities and faster speeds are implied results of reduced size device. Moreover, it is possible to fabricate many elements in close proximity to each other with standard lithographic techniques. Although the critical dimensions are sub-micron, conventional semiconductor fabrication techniques may be used to produce the nanomechanical elements. Indeed, standard photolithography or nanoimprint lithography are sufficient to create nanomechanical memory arrays with read/write access times as fast as 500 MHz, for example. Elements can be formed to be nearly identical with each other, leading to nearly identical resonance frequencies. Tolerances in the fabrication process lead to natural variations in the resonance frequencies of the elements, however it is possible to compensate for these differences. Alternately, or in addition, an element array can be formed that consists of several non-identical elements located at a single address, as illustrated in FIG. 3. The different memory elements distinguished by their different dimensions permits them to be separately accessed due to their unique resonances.

Other stimulation techniques besides magnetomotive are available for operating the nanomechanical memory elements. Although the magnetomotive technique described above is advantageous for its simplicity and sensitivity, it uses large magnetic fields, typically created with superconducting solenoid magnets held at liquid helium temperatures of about 4 Kelvin. Although it is possible to place a sample within a room-temperature vacuum cell at the center of such a magnet, the magnet itself implies a low-temperature technique. In addition, the magnetic fields are often in the range of several Tesla (T), which is not a practically viable option for a realistic implementation.

However, other techniques are available for room-temperature, magnetic-field free operation of the nanomechanical memory devices according to the present invention.

There are no significant changes in the dynamics, physics, or method of operation of these memory elements for application of these other techniques. The other techniques include accessing and stimulating micromechanical and nanomechanical memory devices through capacitive, piezoelectric and/or optical methods.

A typical optical method involves shining a laser on the mechanical device and setting up an interference pattern that describes the motion. Although effective for larger structures, optical techniques tend to break down as the device size is reduced, due to the limitations inherent in the spot size of the laser.

Capacitive techniques provide a number of advantages for both excitation and detection of the motion of nanomechanical elements, including being effective at room temperature and in air. Capacitive techniques typically operate on the principle of inducing motion via the application of an AC signal to a gate that is capacitively coupled to a grounded resonator. The resulting motion can be detected either by observing the subsequent changes in the voltage between the oscillator and a second gate, or through the application of optical methods. It is also possible to set up a differential capacitive measurement by providing four gates, rather than two.

Figure 15:
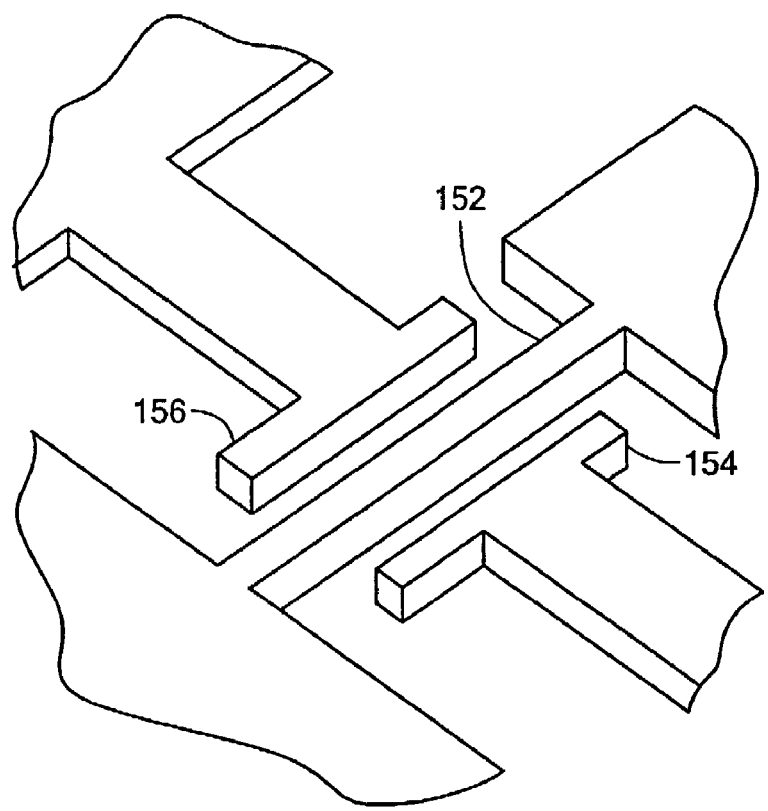
FIG. 15 is a perspective view of a beam with capacitive coupling elements.
Figure 16:
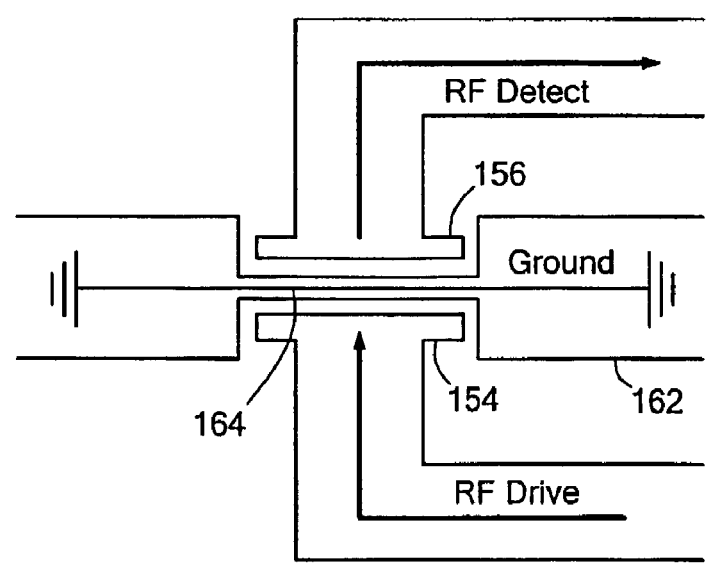
FIG. 16 is a schematic diagram illustrating one possible operative scheme of a nanomechanical element with capacitive coupling.

Referring to FIG. 15, a capacitively coupled beam 152 is excited and read through gates 154, 156, respectively. Gates 154, 156 are placed on either side of beam 152 and, according to an exemplary embodiment, driven with an RF signal for excitation and detection. This drive and detection arrangement is illustrated in FIG. 16. An RF drive signal with a signal modulation are applied to gate 154, which induces motion through capacitive coupling with grounded electrode 162 atop oscillator element 164. The resulting motion generates a voltage signal between grounded oscillator 162, 164, and detection, or reading gate 156. The voltage signal is monitored for changes in state of element 164 to derive a bistable memory operation.

Figure 17:
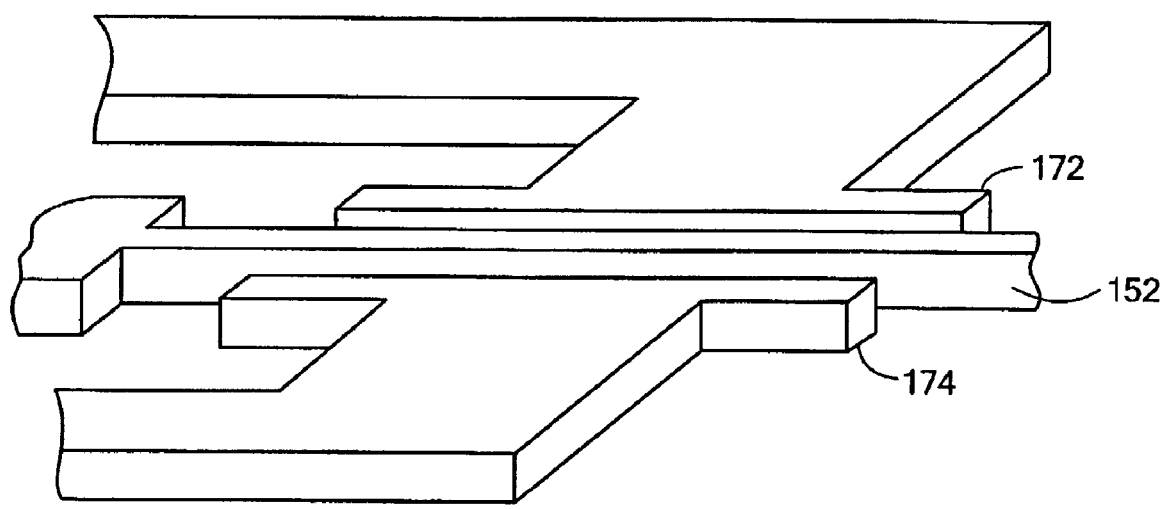
FIG. 17 is a perspective view of a capacitive coupled beam according to an embodiment of the present invention.

Referring to FIG. 17, beam 152 is illustrated as being suspended above the silicon substrate. According to another exemplary embodiment, coupling electrodes 172, 174 may be located beneath the oscillator, or may be vertically oriented rather than laterally.

Figure 18:
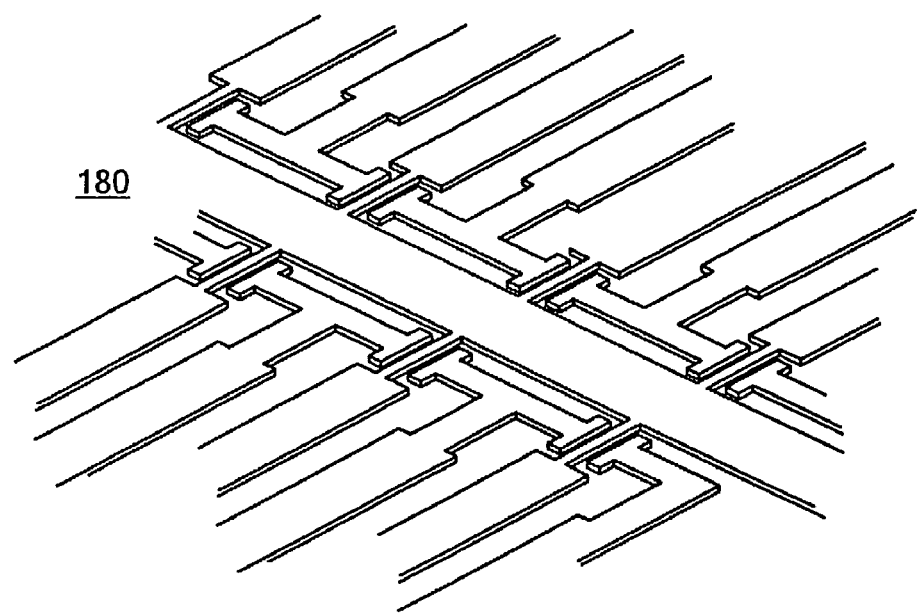
FIG. 18 is a perspective view of an array of capacitively coupled elements in accordance with an embodiment of the present invention.

Referring to FIG. 18, an array 180 of capacitively coupled elements is illustrated. The elements in array 180 are addressed capacitively and are nearly identical with each other.

Figure 19:
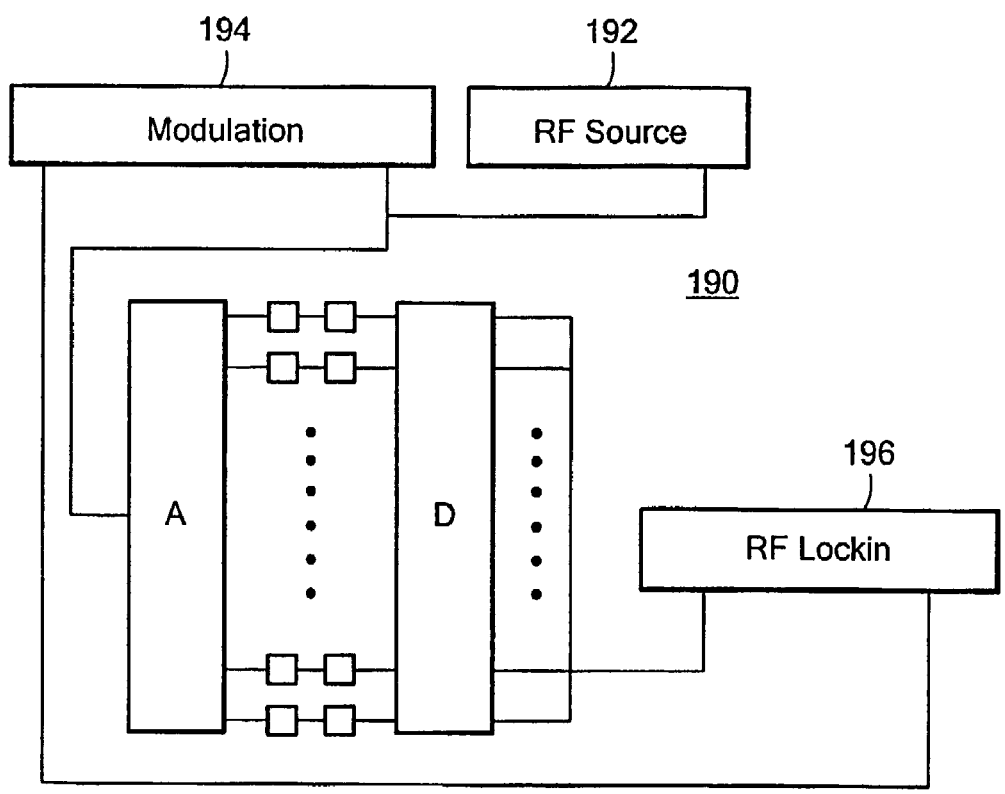
FIG. 19 is a schematic diagram illustrating one possible operative scheme of an array of memory elements in accordance with an embodiment of the present invention.

Referring to FIG. 19, an exemplary realization of a multi-element memory cell 190 is illustrated. An array of individually addressed elements is coupled to circuitry formed as an addresser A and a decoder D. The elements are fabricated to have similar, or nearly identical, resonance frequencies. An RF source 192 generates an RF signal that is modulated by modulator 194. The modulated signal is provided to addresser A, upon which addresser A determines an element to which a write operation is applied. Decoder D reads a state of a given element, and passes a voltage signal to RF lock-in 196, which is referenced to RF source 192 through modulator 194.

Figure 20:
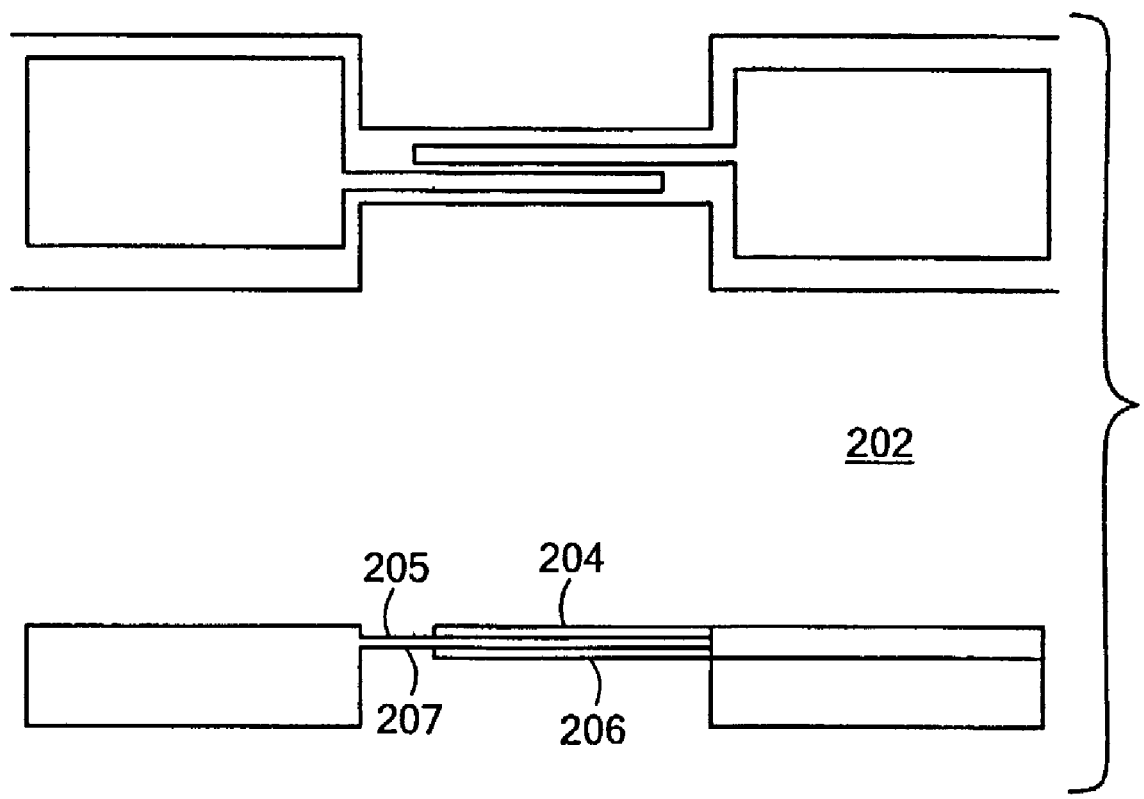
FIG. 20 is a plan view and a cross-sectional view of a clamped piezoelectrically-excited bridge element in accordance with an embodiment of the present invention.
Figure 21:
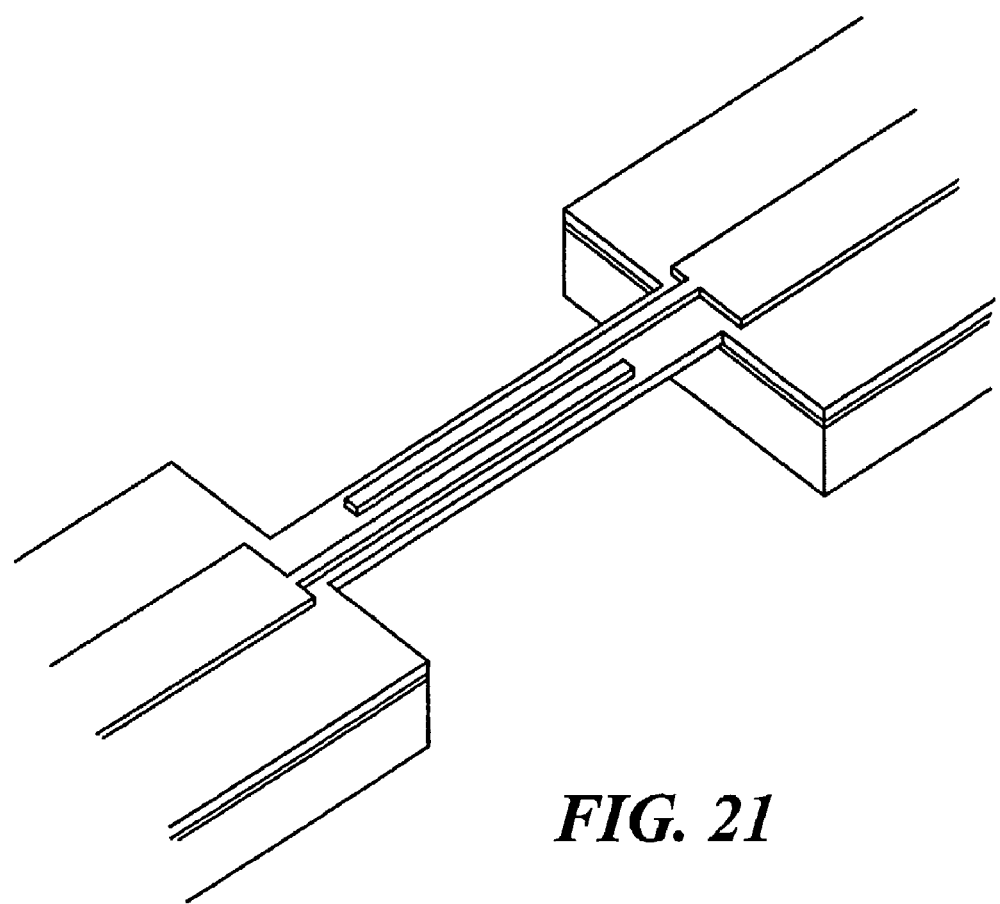
FIG. 21 is a top perspective view of the element of FIG. 20.
Figure 22:
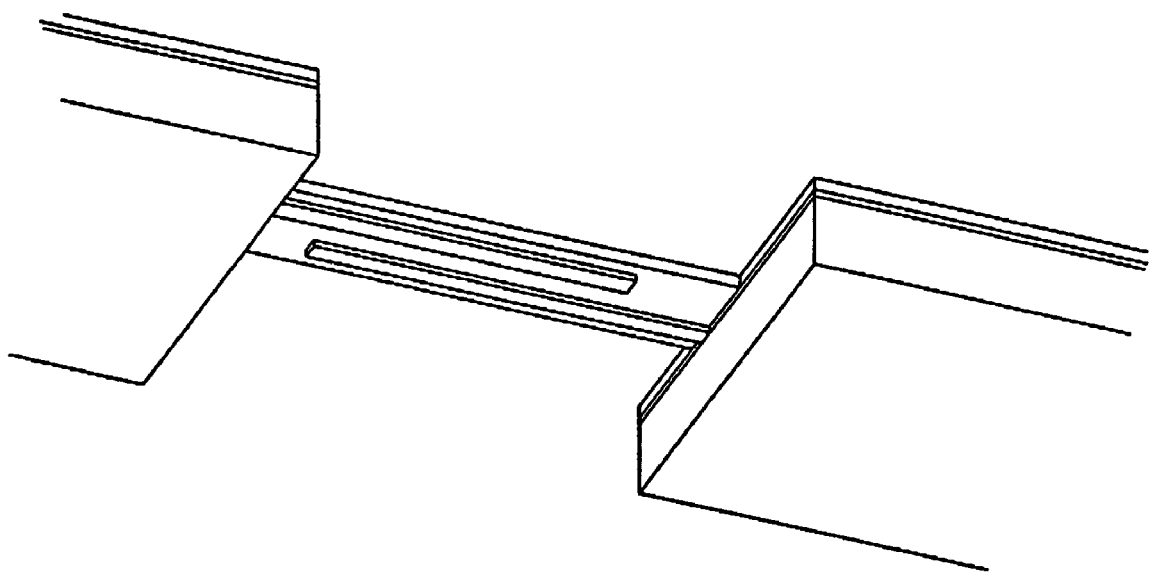
FIG. 22 is a bottom perspective view of the element of FIG. 20.

Referring to FIG. 20, it is also possible to fabricate a device 202 out of a piezoelectric material such as quartz, for example. Piezoelectric device 202 can be excited and read through piezoelectric excitation and detection of the motion of the resonating device. Two opposing contacts 204, 206 are used to apply an AC voltage difference between the top and bottom of device 202. The voltage difference produces a strain through piezoelectric forces to induce a voltage between a second pair of top/bottom contacts 205, 207. The induced voltage permits a read operation through contacts 205, 207. A voltage difference may be applied between any top/bottom set of electrodes to induce a strain in device 202, resulting in a voltage signal read by the other top/bottom set of electrodes. FIGS. 21 and 22 are perspective views illustrating an exemplary orientation of electrode pairs.

Piezoelectric driven devices opens the present invention to the application of a number of different materials that may be used to fabricate devices according to the present invention. Materials used to fabricate capacitive or piezoelectric driven devices include but are not limited to silicon beams fabricated from an SOI wafer, silicon nitride (SiN), silicon carbide (SiC), gallium arsenide (GaAs), gallium nitride (GaN), quartz, and diamond. In addition, it is possible to fabricate these structures out of pure metals, bimetallic strips, or other heterogeneous material compositions such as semiconductor/metal compositions, two or more different semiconductor materials, and so forth. Each composition possesses distinct advantages and disadvantages, and the overall operation of the device remains consistent.

Forming doubly clamped beams according to the present invention may be carried out using bimetals or multiple layer materials. In accordance with the present invention, a device with a built-in compressive strain is fabricated that exhibits inherent nonlinear behavior. The nonlinear device can be driven without the use of relatively large driving forces described previously. Indeed, any driving force, no matter how small, applied to the nonlinear device results in a nonlinear response as a function of frequency. The relatively small driving force applied to the nonlinear device generates dynamic bistability through the creation and detection of distinct amplitude states. Accordingly, the driving AC force and modulation can be significantly reduced, resulting in significant power requirement reductions for these devices.

According to another embodiment of the present invention, a multi-stable mechanical memory device is provided that exhibits more then two distinct stable amplitude states. In one embodiment, the multi-stable device is formed with a higher degree of non-linearity than the bistable devices discussed above. The formation of the device includes the introduction of additional compressive strain to increase the non-linearity of the device. In another embodiment, additional non-linearity is introduced into the device through stronger or higher amplitude driving forces, leading to additional states in the driven device. Memory devices with three or more distinct states in accordance with the present invention permit higher density information storage and manipulation. The higher density of information leads to greater efficiency across entire applications at all levels, producing significant savings in space and power.

In addition, while planar devices have been illustrated herein, the same devices may be constructed to have a vertical, or out-of-plane orientation. Accordingly, combination of memory elements in different orientations can be provided to further improve information density in a given application. For example, the present invention contemplates the formation and use of three-dimensional memory elements or blocks of elements.

The nanomechanical memory elements discussed herein can be formed to have critical dimensions in the range of from about 10 to about 500 nm. The utilization of a block-copolymer fabrication method may be able to realize vertical-column structures with critical dimensions below 10 nm. These dimensions offer performance advantages in speed and packing density comparable to present industry standards. In addition, the elements of the present invention are reliably operated in a manner distinct from that of any other memory system.

Aside from the basic doubly-clamped beam or singly-clamped cantilever, the present invention contemplates a number of realizations of a memory element based on dynamic states. In addition to the flexural modes described earlier, it is possible to observe and manipulate dynamic multi-stable states in torsional or shear modes. Alternative device geometry may be used to realized the present invention, including paddle-type devices, diaphragms, or vertical rods. Device geometries may also include combinations of beams, cantilevers, or diaphragms, for example, in which the motions of the different sub-elements, either jointly or severally, create the different states of the memory cell. For example, relative or differential motion based on a number of sub-elements may be used to realize the memory element of the present invention.

Figure 23:
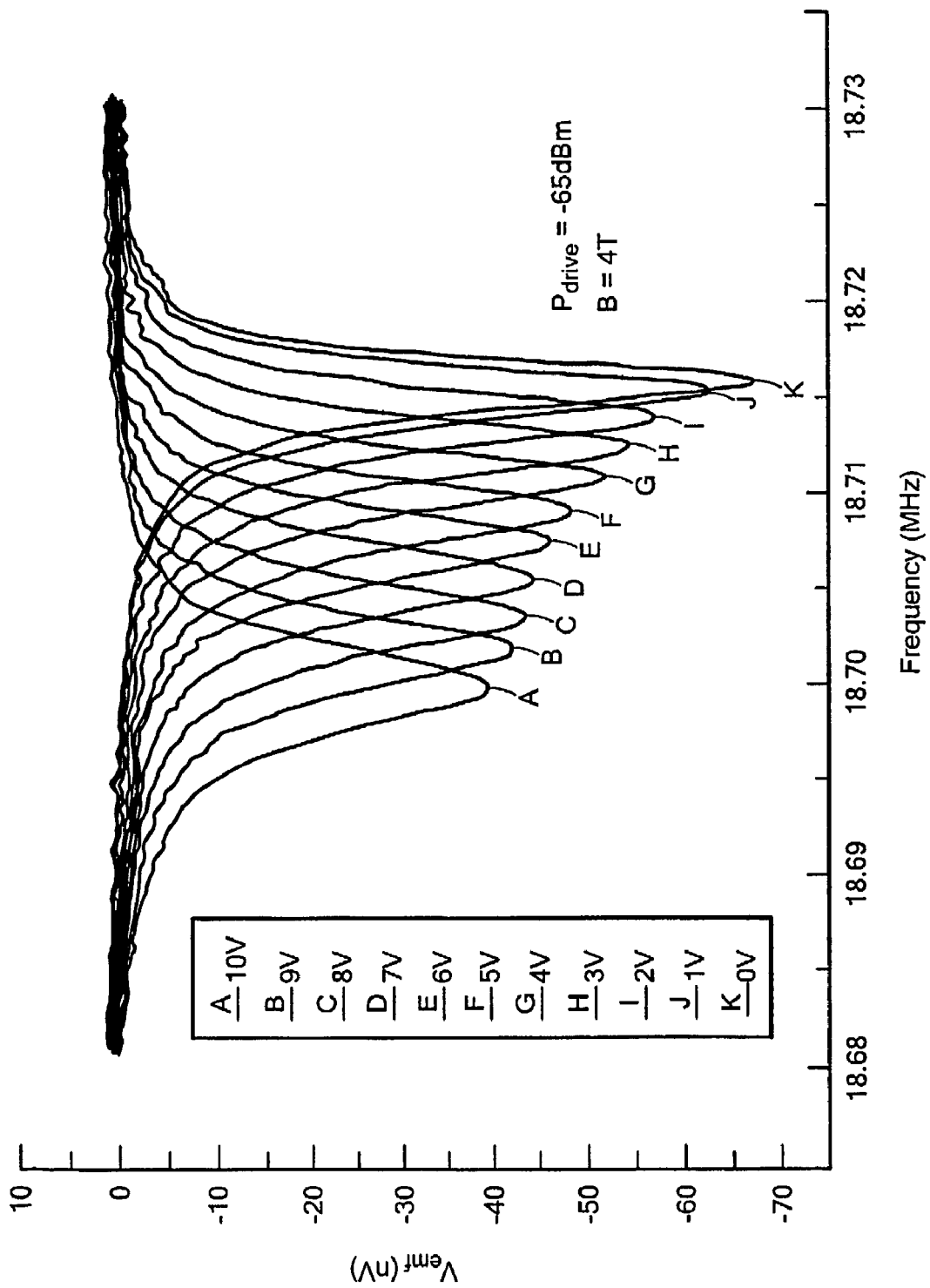
FIG. 23 is a graph illustrating dynamic states based on distinct frequencies produced through corresponding variations in applied DC biases.

According to another exemplary embodiment of the present invention, the addition of a suitable DC bias induces a frequency shift on a doubly-clamped beam structure without forcing the structure into nonlinear behavior. That is, fundamental or higher-order frequencies of a beam in a linear response mode can be controllably and reproducibly shifted between one or more different frequency values through the application of a DC bias signal. The modulation signal has a similar form to that of the nonlinear case, but the "1" and "0" states are frequency-dependent dynamic states, rather than nonlinear amplitude states. That is, in contrast to differentiating between two voltages at a single frequency, the circuit uses two frequencies with the same or similar voltage responses to provide an element with one or more dynamic states. Multiple states for the element are provided through the application of one or more DC biases to the element to achieve distinct frequencies in distinct states. An illustration of frequency dependent states that are produced through the application of a DC bias is provided in the graph of FIG. 23. FIG. 23 shows the distinct frequency dependent states of an element subjected to various DC biases. The distinct frequencies may have a tolerance sufficient to permit easy recognition of the separate states, based, for example on a DC bias step of 1 Volt, as illustrated in FIG. 23.

A practical realization of the nanomechanical memory elements described according to the present invention need not be limited to a solely mechanical device. For example, the present invention contemplates hybrid devices, consisting of mechanical and electrical or electro-capacitive elements to form a memory cell. That is, for example, distinct variations in capacitance may be used as the operative dynamic states for the memory cell, which may be achieved using mechanical or electrical drives or operations. In addition, an overall read/write circuit may use the hybrid devices to take advantage of conventional or unique electronic, mechanical, or hybrid input/output protocols.

Finally, it will be appreciated that modifications to and variations of the above-described apparatus and method may be made without departing from the inventive concepts disclosed herein. Accordingly, the invention should not be viewed as limited except by the scope and spirit of the appended claims.

What is claimed is:

1. A nanoscale mechanical memory element comprising:
a bridge element between first and second supports;
means for vibrationally exciting said bridge at a first frequency representative of a first state;
means for vibrationally exciting said bridge at a second frequency lower than said first frequency representative of a second state; and
means for sensing the state of said bridge.

2. The memory of claim 1 wherein said bridge and supports are formed of a material selected from the group consisting of silicon, diamond on silicon, gallium, bimetal, and quartz.

3. The memory of claim 1, wherein the memory element is formed of a material selected from the group consisting of SOI wafer, silicon nitride (SiN), silicon carbide (SiC), gallium arsenide (GaAs), gallium nitride (GaN), quartz, diamond, pure metals, bimetallic strips, heterogeneous semi-conductor/metal compositions, and heterogeneous compositions of two or more different semiconductor materials.

4. The memory of claim 1 wherein said first frequency excitation means includes means for applying force to said bridge selected from the group consisting of means acting by electrostatic force, means acting by electromagnetic force, means acting by piezoelectric force, means acting by magnetomotive force and means acting by a current with an orthogonal magnetic field.

5. The memory of claim 1, wherein said means for exciting at a second frequency is selected from the group consisting of means acting by electrostatic force, electromagnetic force, piezoelectric force, magnetomotive force, and a current with an orthogonal magnetic field.

6. The memory of claim 1, wherein the first frequency excitation comprises an electrical signal capacitively applied to said bridge.

7. The memory of claim 1, further comprising means for vibrationally exciting said bridge at one or more frequencies different from said first frequency representative of a third or more states.

8. The memory of claim 1, wherein said states result from torsion, shear, or longitudinal modes.

9. The memory of claim 1, wherein the element is part of a greater electrical, mechanical, or electro-mechanical device or circuit.

10. The memory of claim 1, further comprising a plurality of elements arranged in an array.

11. The memory of claim 10, wherein at least two elements have a similar dimension.

12. The memory of claim 10, wherein at least two elements have different dimensions.

13. The memory of claim 1, wherein a structure of the element is selected from the group consisting of a diaphragm structure, a paddle structure and a cantilever structure.

14. The memory of claim 1, wherein the structure of the element includes a combination of structures selected from the group consisting of a doubly clamped beam, a cantilever, a paddle, and a diaphragm.

15. The memory of claim 14, wherein the element state can be represented by configurations of the combination structures.

16. The memory of claim 1, further comprising a DC bias applied to the element.

17. The memory of claim 16, further comprising a frequency shift related to the DC bias, wherein the element states are related to the frequency shift.

18. The memory of claim 17, further comprising a plurality of frequency shift related states operable to represent information for storage.

19. A method for storing information, comprising:
providing a first excitation to a nanoscale mechanical memory element to produce a first state of dynamic stability;
providing a second excitation to the nanoscale mechanical memory element to produce a second state of dynamic stability; and
selecting between providing the first and second excitation to store information in the nanoscale mechanical memory element.

20. The method according to claim 19, further comprising sensing a state of the nanoscale mechanical memory element.

21. A method for storing information, comprising operating the element claim 1.

22. A nanoscale mechanical multistate element, comprising:
a nanoscale structure suspended from a support for exhibiting a vibrational response;
a vibrational excitation source coupled to the structure for imparting a vibrational excitation to the structure;
the structure having a plurality of vibrational response states resulting from a plurality of respective vibrational excitations imparted by the vibrational excitation source.

23. The element according to claim 22, further comprising a detector for detecting a vibrational response state of the structure.

24. The element according to claim 22, further comprising a plurality of structures arranged in an array.

* * * * *